United States Patent
Yamaguchi

(10) Patent No.: US 6,953,748 B2
(45) Date of Patent: Oct. 11, 2005

(54) METHOD OF MANUFACTURING SEMICONDUCTOR DEVICE

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/898,281

(22) Filed: Jul. 26, 2004

(65) Prior Publication Data

US 2005/0026314 A1 Feb. 3, 2005

(30) Foreign Application Priority Data

Jul. 31, 2003 (JP) .................................... 2003-283665

(51) Int. Cl.⁷ ............................................. H01L 21/44
(52) U.S. Cl. ....................... 438/667; 438/587; 438/597
(58) Field of Search .................... 438/400, 401, 438/458–460, 466, 478, 763, 48, 55, 68, 69, 7, 18, 110, 113, 128, 129, 462, 464, 597–599, 618, 620, 666, 667, 669, 13, 14–17, 23–25, 29, 101, 107, 109, 142, 149, 167, 171, 186, 353, 469; 257/270

(56) References Cited

U.S. PATENT DOCUMENTS

| | | | | |
|---|---|---|---|---|
| 5,882,995 A | * | 3/1999 | Tsuji et al. ................. | 438/597 |
| 6,395,604 B1 | * | 5/2002 | Kubo et al. ................. | 438/270 |
| 6,492,195 B2 | * | 12/2002 | Nakanishi et al. .......... | 438/106 |
| 6,563,079 B1 | * | 5/2003 | Umetsu et al. ........ | 219/121.71 |
| 6,600,189 B1 | * | 7/2003 | Sato et al. .................. | 257/301 |
| 6,660,545 B2 | | 12/2003 | Furusawa | |
| 6,693,358 B2 | * | 2/2004 | Yamada et al. ............. | 257/774 |
| 2001/0020733 A1 | * | 9/2001 | Sasaguri ..................... | 257/653 |
| 2003/0194860 A1 | * | 10/2003 | Nemoto ..................... | 438/667 |
| 2004/0251554 A1 | * | 12/2004 | Masuda ...................... | 257/773 |

FOREIGN PATENT DOCUMENTS

| | | |
|---|---|---|
| JP | A-62-219954 | 9/1987 |
| JP | 11-168104 | 6/1999 |
| JP | A-2000-510288 | 8/2000 |
| JP | A-2002-359347 | 12/2002 |
| JP | A-2003-282819 | 10/2003 |
| WO | WO 98/19337 | 5/1998 |

\* cited by examiner

*Primary Examiner*—Ha Nguyen
*Assistant Examiner*—Andre Stevenson
(74) *Attorney, Agent, or Firm*—Oliff & Berridge PLC

(57) ABSTRACT

To enhance and/or improve reliability in a method of forming a semiconductor device. An exemplary method of forming a semiconductor device forms a conductive part within a concave portion which is formed in a first surface of a semiconductor substrate. The semiconductor substrate includes an integrated circuit. The method also thins the substrate by removing a part of a second surface of the semiconductor substrate so as to make the conductive part penetrate from the first surface to the second surface, and cuts the semiconductor substrate into pieces. An electric property of the semiconductor substrate is inspected through the conductive part after the conductive part is formed.

8 Claims, 4 Drawing Sheets

METHOD OF MANUFACTURING SEMICONDUCTOR DEVICE

BACKGROUND OF THE INVENTION

1. Field of Invention

The present invention relates to a method of manufacturing a semiconductor device.

2. Description of Related Art

The related are includes a semiconductor device with three-dimensional mounting. Also, in accordance with the related art, a penetrating electrode is formed on a semiconductor substrate, and more than one semiconductor substrate is stacked-up, and then the penetrating electrode formed on a upper substrate and the penetrating electrode formed on a lower substrate are coupled. In a related art method, an inspection process checking an electric property of the semiconductor substrate is conducted before the penetrating electrode is formed. In the inspection process, since an end terminal of an inspection tool contacts with the electrode (an aluminum pad), a trace sometimes remains on the surface of the electrode. This decreases reliability in forming the penetrating electrode, and it can lead to a lower yield of the semiconductor device.

The related art also includes a device disclosed in Japanese Unexamined Patent Publication No. 2002-359347.

SUMMARY OF THE INVENTION

An exemplary embodiment of the invention addresses the above-mentioned and/or other problems, and enhances and/or improves reliability in a method of forming a semiconductor device.

An exemplary method of manufacturing a semiconductor device of the present invention includes (a) forming a conductive part within a concave portion that is formed in a first surface of a semiconductor substrate having an integrated circuit, (b) thinning the semiconductor substrate by removing a part of a second surface of the semiconductor substrate so as to make the conductive part penetrate from the first surface to the second surface, (c) cutting the semiconductor substrate into pieces. The method may also include inspecting an electric property of the semiconductor substrate through the conductive part following step (a). In accordance with the above-described exemplary method of manufacturing a semiconductor device, since an electric property of the semiconductor substrate is checked after the formation process of the conductive part, the inspection process does not adversely affect reliability in the formation process of the conductive part. Consequently, reliability of the method of manufacturing a semiconductor device will be enhanced and/or improved.

In the exemplary method of manufacturing a semiconductor device, the conductive part may be formed to have a brazing layer on its top surface in step (a). For example, the brazing layer is soft so that an end terminal of an inspection tool can securely contact with the conductive part without slipping. Even if a trace is marked on the top surface part of the conductive part when the end terminal contacted, the mark can be reduced or eliminated by melting at least a part of the brazing layer in a later process.

In the exemplary method of manufacturing a semiconductor device, the conductive part may be formed to have a gold layer on its top surface in step (a). For example, the gold layer is soft so that an end terminal of an inspection tool can securely contact with the conductive part without slipping. Even if a trace is marked on the top surface part of the conductive part when the end terminal contacted, the mark can be reduce or eliminated by melting at least a part of the gold layer in a later process.

In the exemplary method of manufacturing a semiconductor device, the inspecting process may be conducted before step (b). This will make a handling of the semiconductor substrate easier compared to a case which the inspection process is carried out after the thinning process. In particular, it can prevent the semiconductor substrate from being impaired.

In the exemplary method of manufacturing a semiconductor device, step (c) may further include (c1) providing a reinforcing member on the semiconductor substrate, (c2) conducting the inspecting process and (c3) cutting the semiconductor substrate. As such, a handling of the semiconductor substrate may be easier since the semiconductor substrate is reinforced with the reinforcing member. In particular, it may prevent the semiconductor substrate from being impaired.

In the exemplary method of manufacturing a semiconductor device, the reinforcing member has a tape applied to one of the first surface or the second surface and a supporting member which supports the tape. The exemplary method of manufacturing a semiconductor device may include stacking a plurality of semiconductor devices which are manufactured using the above-mentioned exemplary method.

DETAILED DESCRIPTION OF EXEMPLARY EMBODIMENTS

Figure 1A:
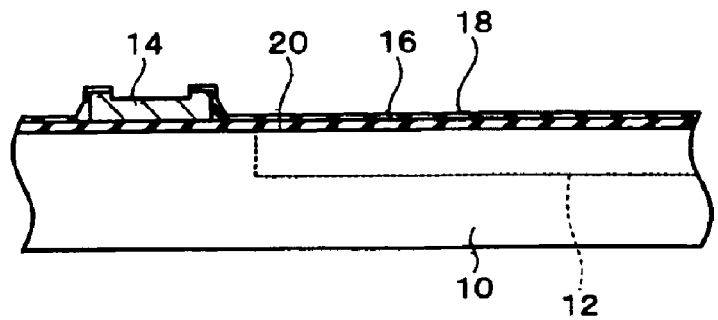
FIGS. 1A through D are schematics that show a method for manufacturing a semiconductor device according to an exemplary embodiment of the present invention.

Exemplary of the present invention are described below with reference to the accompanying figures. FIG. 1A through FIG. 4 show a method of manufacturing a semiconductor device according to an exemplary embodiment of the present invention.

A semiconductor substrate 10 (for example, a silicon substrate) is provided. The semiconductor substrate 10 may be a semiconductor wafer or a semiconductor chip. On the semiconductor substrate 10, an integrated circuit 12 is formed. In a case of the semiconductor wafer, the integrated circuit 12 is provided in the plural number (see FIG. 3A). In a case of the semiconductor wafer, a single of the integrated circuit 12 is formed. An electrode 14 (for example, a pad) electrically coupled with the integrated circuit 12 is formed on the semiconductor substrate 10. The electrode 14 is provided in the plural number to each integrated circuit 12. The electrode 14 of provided in the plural number may be arranged along edges of the integrated circuit 12 (for example, at two facing sides or four sides of its rectangular area). The electrode 14 is made of a metal, such as aluminum or copper, and formed to be thin and flat. According to this exemplary embodiment of the present invention, the electrode 14 is not used for checking an electric property in an inspection process, so that the electrode 14 is hardly damaged. Therefore, reliability in forming a penetrating electrode (a conductive part 30) will be enhanced and/or improved, and thereby the yield ratio of the semiconductor device will also be enhanced and/or improved. The penetrating electrode will be described in detail later.

A passivation film 16 and another passivation film 18, each film made up of one layer or more, are formed on the semiconductor substrate 10. The passivation films 16 and 18 may be formed of SiO2, SiN, polyimide resin and the like. In the example shown in FIG. 1A, the electrode 14 and a wiring (not shown in the figures) which connects the integrated circuit 12 and the electrode 14 are formed on the passivation film 16. The passivation film 18 is formed at least avoiding a part of the surface of the electrode 14. The passivation film 18 may be formed to cover the whole surface of the electrode 14 as long as a part of the passivation film 18 is removed later by etching, for example, so as to expose part of the surface of the electrode 14. Either dry etching or wet etching may be applied to the etching. The surface of the electrode 14 may be etched when the passivation film 18 is etched.

Figure 1B:
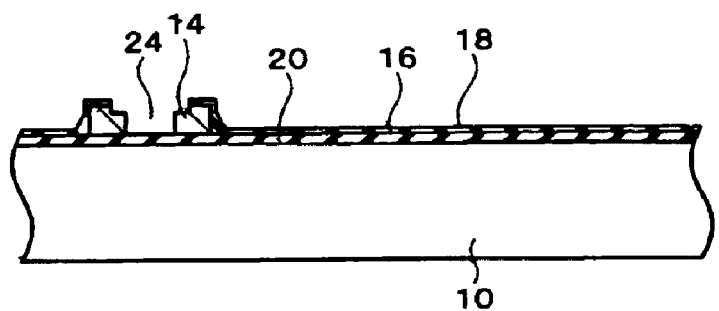

In this exemplary embodiment, a concave portion 22 (see FIG. 1C) which starts from a first surface 20 of the semiconductor substrate 10 is formed in the semiconductor substrate 10. The first surface 20 is a surface on which the electrode 14 (or the integrated circuit 12) is formed. The concave portion 22 is formed avoiding elements and wirings of the integrated circuit 12. As shown in FIG. 1B, a through-hole 24 may be formed in the electrode 14. Etching (dry etching or wet etching) may be applied to form the through-hole 24. The etching may be performed after a resist (not shown in the figures) patterned by photolithography is formed. If the passivation film 16 is formed under the electrode 14, a through-hole 26 (see FIG. IC) is also formed in the passivation film 16. If the etching of the electrode 14 stops at where the passivation film 16 is, another etchant, which is different from one used for etching the electrode 14, can be used to form the through-hole 26. In that case, another resist (not shown in the figures) patterned by photolithography may be formed.

Figure 1C:
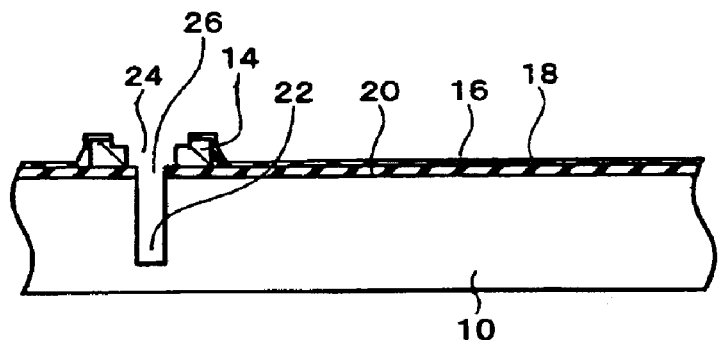

As shown in FIG. 1C, the concave portion 22 is formed in the semiconductor substrate 10 to communicate with the through-hole 24 (and the through-hole 26). The through-hole 24 (and the through-hole 26) as well as the concave portion 22 can be called as a concave portion. Etching (dry etching or wet etching) may be also applied to form the concave portion 22. The etching may be performed after a resist (not shown in the figures) patterned by photolithography is formed. Alternatively, a laser (for example, a CO2 laser, an Yttrium Aluminum Garnet laser (YAG) and the like) may be applied to form the concave portion 22. The laser may also be applied to form the through-holes 24 and 26. The concave portion 22, the through-holes 24 and 26 may be formed consecutively with a single type of etchant or laser. A sandblast processing may be applied to form the concave portion 22.

Figure 1D:
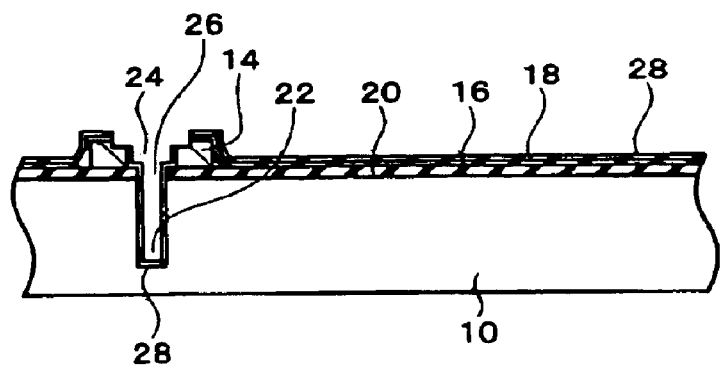

As shown in FIG. 1D, an insulating layer 28 may be formed inside the concave portion 22. The insulating layer 28 may be an oxide film or a nitride film. For example, if the semiconductor substrate 10 is made of Si, the insulating layer 28 may be made of SiO2 or SiN. The insulating layer 28 is formed on the bottom surface and inner wall of the concave portion 22. However, the insulating layer 28 is formed not to fill up the concave portion 22, in other words, the insulating layer 28 forms a concave portion. The insulating layer 28 may be formed on the inner wall of the through-hole 26 that is formed in the passivation film 16. The insulating layer 28 may also be formed on the passivation film 18.

Further, the insulating layer 28 may be formed on the inner wall of the through-hole 24 that is formed in the electrode 14. The insulating layer 28 is formed avoiding a part of the surface of the electrode 14 (for example, its upper surface). The insulating layer 28 may be formed to cover the whole surface of the electrode 14 as long as a part of the insulating layer 28 is removed later by etching (dry etching or wet etching) so as to expose part of the electrode 14. The etching may be performed after a resist (not shown in the figures) patterned by photolithography is formed.

Next, the conductive part 30 (see FIG. 2D) is formed in the concave portion 22 (for example, inside the insulating layer 28). The conductive part 30 may consist of a single layer or multiple layers. In the exemplary embodiment, the conductive part 30 includes a foundation part 32, a central part 34 and a top surface part 36. As shown FIG. 2A, the central part 34 is formed after forming the foundation part 32 in the conductive part 30. The upper surface of the central part 34 (on which the top surface part 36 is formed) is formed to be flat. The central part 34 may be formed of Cu, W or doped polysilicon (for example, low-temperature polysilicon). The foundation part 32 may include at least a barrier layer. The barrier layer reduces and/or prevents a material of the central part 34 or a seed layer that will be described below from diffusing into the semiconductor substrate 10 (made of Si, for example). The barrier layer may be formed of a different kind of material (for example, TiW, TiN) from that of the central part 34. When the central part 34 is formed by electroplating, the foundation part 32 may include a seed layer. The seed layer is formed after forming the barrier layer. The seed layer can be formed of the same material as that of the central part 34 (for example, Cu). The conductive part 30 (or at least its central part 34) can be formed by electroless planting or ink jetting.

Figure 2A:
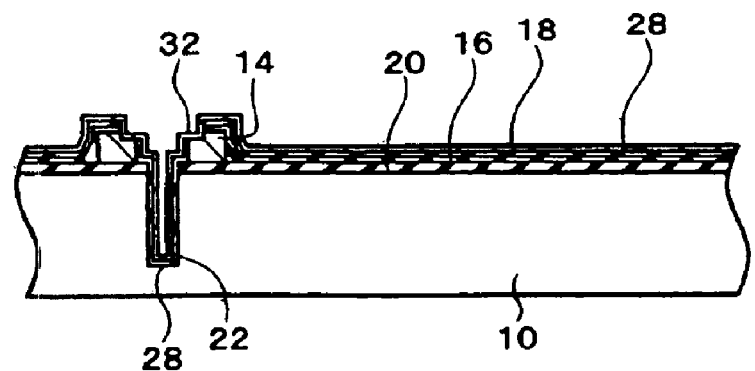
FIGS. 2A through D are schematics that show the method for manufacturing a semiconductor device according to the exemplary embodiment of the present invention.
Figure 2B:
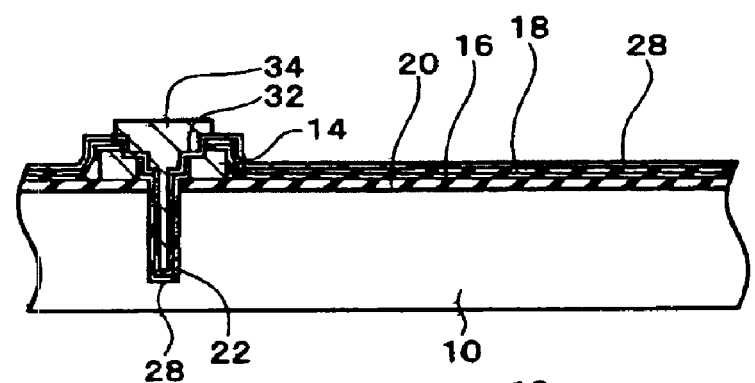
Figure 2C:
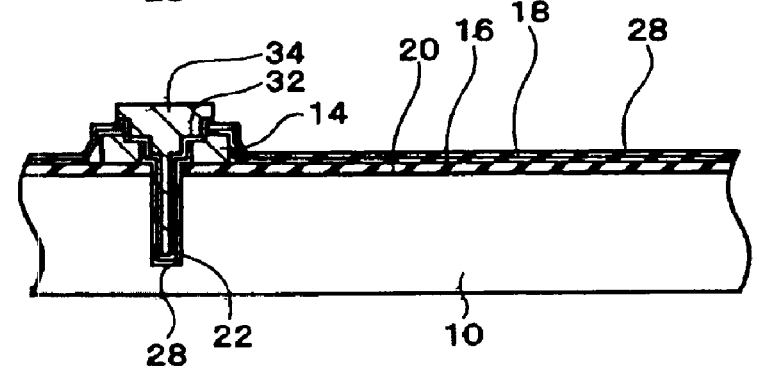

As shown in FIG. 2B, if the foundation part 32 is formed on the passivation film 18, a part of the foundation part 32 which is placed on the passivation film 18 (and the insulating film 28) is etched as shown in FIG. 2C.

Figure 2D:
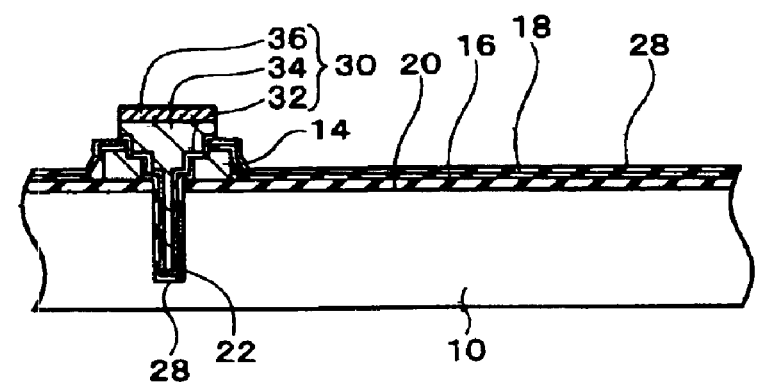

As shown in FIG. 2D, the top surface part 36 is formed on the outside (for example, the upper surface) of the central part 34. The top surface part 36 may be a brazing layer formed of a brazing material. In other words, the conductive part 30 may be formed to have the brazing layer in its top surface 36. The brazing layer may be formed of solder, for example, either a soft solder or a hard solder can be used. The brazing layer may be formed while covering the area other than the upper surface of the central part 34 with a resist. As a modification, the top surface part 36 may be a gold layer including at least gold (Au).

As described above, the conductive part 30 is formed. A part of the conductive part 30 is placed within the concave portion 22 of the semiconductor substrate 10. Since the insulating layer 28 is interposed between the inner wall of the concave portion 22 and the conductive part 30, an electrical connection between the two is not available. The conductive part 30 is electrically coupled with the electrode 14 (the integrated circuit 12). For example, the conductive part 30 may contact with an exposed part of the electrode 14 from the insulating layer 28. Also, the conductive part 30 may be formed only in the area of the electrode 14. Further, the conductive part 30 may project at least above the concave portion 22. For example, the conductive part 30 may project farther than the passivation film 18 (and the insulating layer 28). As an exemplary modification, the central part 34 may be formed as the foundation part 32 remains on the passivation film 18. In that case, a layer communicating with the central part 34 is formed over the passivation film 18 and should be etched.

Figure 3A:
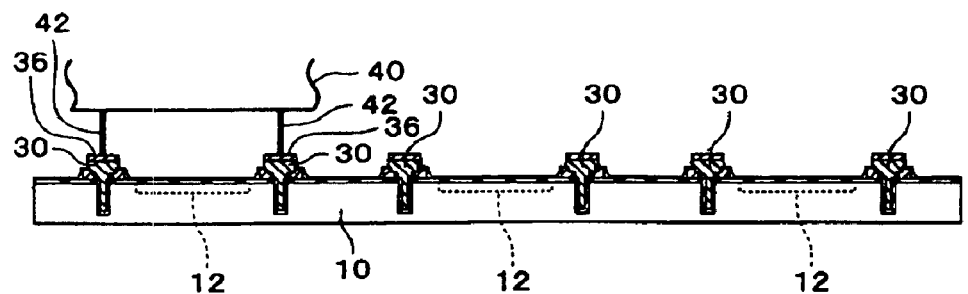
FIGS. 3A through D are schematics that show the method for manufacturing a semiconductor device according to the exemplary embodiment of the present invention.

According this exemplary embodiment, the inspection process of checking an electric property of the semiconductor substrate 10 is conducted after forming the conductive part 30. This makes it possible to detect defects in the integrated circuit 12, the electrode 14, the conductive part 30 and the like. When a defect is found, it is preferable that it is marked. As shown in FIG. 3A, in the inspection process checking an electric property, an end terminal 42 (for example, a needle) of an inspection tool 40 (for example, a probe) is brought into contact with an electric contact area of the semiconductor substrate 10 while the inspection is conducted. The end terminal 42 may be brought into contact with the conductive part 30 (the top surface part 36 in FIG. 3A). A trace of the end terminal 42 may remain on the surface of the conductive part 30. When the top surface part 36 is made of a brazing layer (or a gold layer), the end terminal 42 can securely contact with the conductive part 30 and be retained at the position without slipping since the brazing layer (or the gold layer) is soft. Consequently, the inspection process becomes more reliable. If at least a part of the top surface part 36 is melted in a later process (for example, a mounting process of the semiconductor device), the trace on the top surface part 36 which is marked when the end terminal 42 contacted can be reduced and/or eliminated, so that reliability of the semiconductor device will not be decreased.

As shown in FIG. 3A, the inspection process checking the electric property may be carried out before a thinning process of the semiconductor substrate 10 (see FIG. 3B) in which the thickness of the semiconductor substrate 10 is reduced. It will make it easier to handle the semiconductor substrate 10 (for example, transport to an inspection stage) than a case in which the inspection process follows the thinning process of the semiconductor substrate 10. More specifically, it may prevent the semiconductor substrate 10 from being impaired (cracking and the like).

It is preferable that in the inspection process, checking the electric property of the semiconductor substrate 10 is not conducted before the formation process of the conductive part 30 (for example, at a point when the integrated circuit 12 and the electrode 14 are formed). In this way, the contact trace of the end terminal 42 will not be left on the surface of the electrode 14 and it improves and/or enhances reliability in the formation process of the conductive part 30 (for example, a lithography process).

Figure 3B:
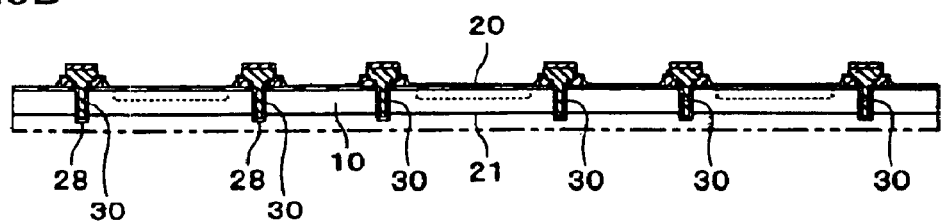
Figure 3C:
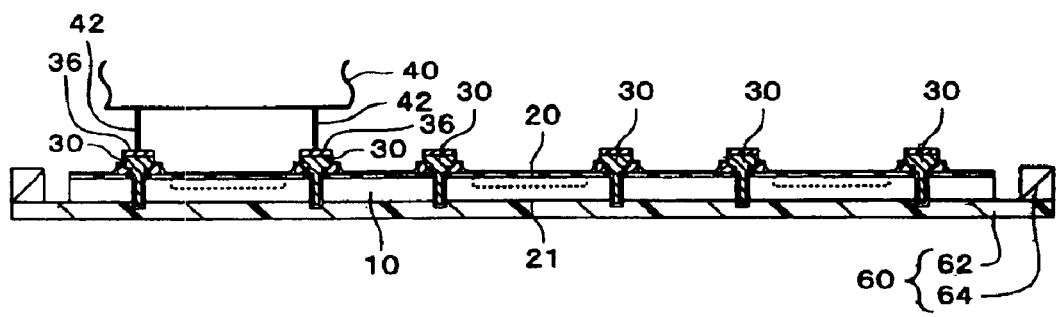

As shown in FIG. 3B, a part of the semiconductor substrate 10 is removed from its second surface 21 and the semiconductor substrate 10 is made to be thinner. For example, this can be performed by at least one chemical or mechanical grinding process. The surface of the semiconductor substrate 10 may be ground and polished with a grind stone, or may be etched. The thinning process of the semiconductor substrate 10 can be broken into several steps. For example, at a first step of the thinning process, the semiconductor substrate 10 may be ground and polished right before the insulating layer 28, in the concave portion 22, is going to be exposed. Then at the following steps of the thinning process, the insulating layer 28 may be exposed. The second surface 21 of the semiconductor substrate 10 may be etched in such a way that the conductive part 30 (more specifically, a part of the conductive part 30 which is within the concave portion 22) protrudes as it is covered with the insulating layer 28. The etching may be conducted with an etchant works more on the semiconductor substrate 10 (of Si, for example) than on the insulating layer 28 (of SiO2, for example). The etchant may be SF6, CF4, or Cl2 gas. The etching may be carried out with a dry-etching apparatus. Also, the etchant may be a compound liquid of hydrofluoric acid and nitric acid or of hydrofluoric acid, nitric acid and acetic acid.

As described above, the conductive part 30 penetrates from the first surface 20 to the second surface 21. The conductive part 30 is called as a penetrating electrode. The conductive part 30 protrudes from at least one of the first surface 20 and the second surface 21 (in FIG. 3B, from the both surfaces). A protruding part of the conductive part 30 from the second surface 21 may be covered with the insulating layer 28. In this case, the conductive part 30 is exposed from the insulating layer 28 in a later process. Or the conductive part 30 may be exposed from the insulating layer 28 in the thinning process.

Figure 3D:
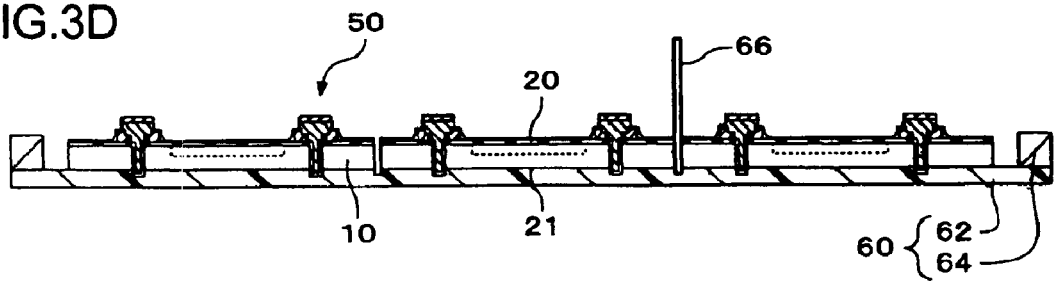

Subsequently, the semiconductor substrate 10 is cut (for example, by dicing) into pieces (a semiconductor device 50) as shown in FIG. 3D. It may be cut along between one integrated circuit 12 and another integrated circuit 12 which are placed next to each other. The semiconductor substrate 10 may be cut on a reinforcing member 60. More specifically, the reinforcing member 60 may be provided on one of the first surface 20 or the second surface 21 of the semiconductor substrate 10. The semiconductor substrate 10 is cut from the other surface. The reinforcing member 60 may include a tape 62 which is applied to one of the first surface 20 or the second surface 21, and a supporting member 64 which supports the tape 62. The tape 62 may be hardened by energy (for example, ultraviolet curing). The supporting member 64 may be formed to be ring shaped and support a peripheral portion of the tape 62. As an exemplary modification, the supporting member may be a plate (for example, a glass plate or a plastic plate) which supports the semiconductor substrate 10 from one of the first surface 20 side or the second surface 21 side (the plate is not shown in the figures). An adhesive agent may be applied on the plate so as to temporarily glue and retain the semiconductor substrate 10.

Instead of (or together with) the above-mentioned inspection process (see FIG. 3A) that comes before the thinning process, an inspection process checking an electric property of the semiconductor substrate 10 may be conducted before cutting the semiconductor substrate following the thinning process. In this way, at least defects caused in the thinning process can be found. Also, the inspection process may be conducted on the above-mentioned reinforcing member 60. This makes it easier to handle the semiconductor substrate 10 (for example, transport to an inspection stage), since the semiconductor substrate 10 is reinforced with the reinforcing member 60. More specifically, it may prevent the semiconductor substrate 10 from being impaired (cracking and the like). Other details in the inspection process may be the same as stated above.

In the cutting process as shown in FIG. 3D, a cutter 66 (for example, a dicer) or a laser (for example, a CO2 laser or a YAG laser) may be used to cut the semiconductor substrate 10. The cutting process may be carried out by mechanical cutting.

Figure 4:
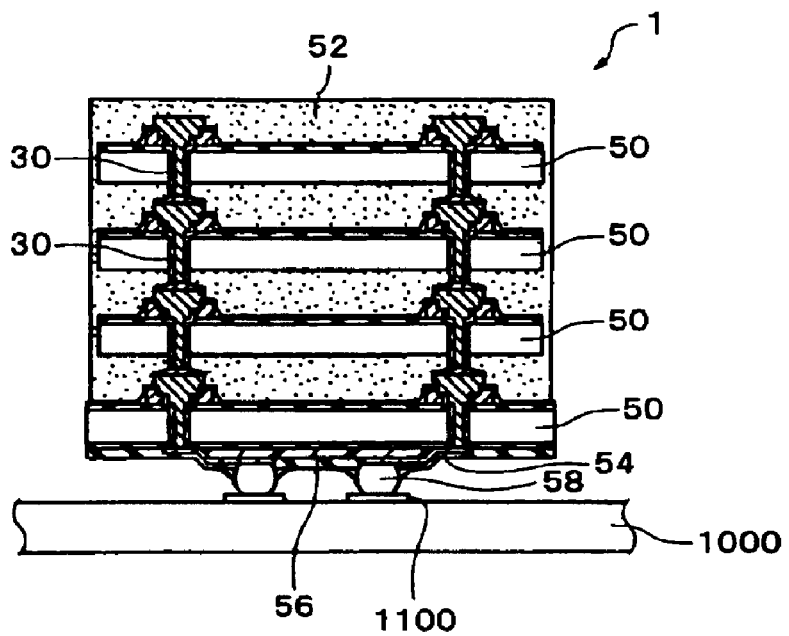
FIG. 4 is a schematic that shows the method for manufacturing a semiconductor device according to the exemplary embodiment of the present invention.

As shown in FIG. 4, the method of manufacturing a semiconductor device according to the exemplary embodiment also includes a step of stacking more than one semiconductor device 50 manufactured in the above-mentioned way. Finally, a semiconductor device 1 having a stack structure is made. One semiconductor device 50 placed upper and another semiconductor device 50 placed lower may be electrically coupled through the conductive part 30. One conductive part 30 may be electrically coupled to another conductive part 30 through a brazing material. A plurality of semiconductor devices are sealed with a sealing member 52. A wiring layer 54 (a relocation wiring layer) may be formed in the semiconductor device 50 that is on the out most side (the one at the bottom in FIG. 4). A part of the wiring layer 54 (for example, a land portion) may be formed on a resin layer 56. An external terminal 58 (for example, a solder ball) may be formed on a part of the wiring layer 54 (for example, a land portion). In the example shown in FIG. 4, the semiconductor device 1 is electrically coupled to a wiring pattern 1100 in a circuit substrate 1000.

Figure 5:
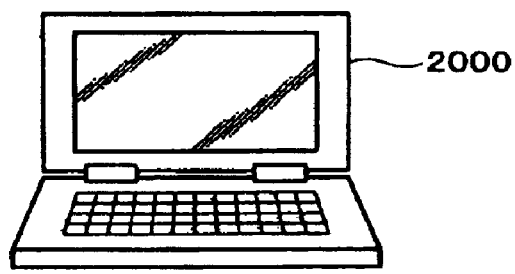
FIG. 5 is a schematic that shows an electric apparatus according to an exemplary embodiment of the present invention.
Figure 6:
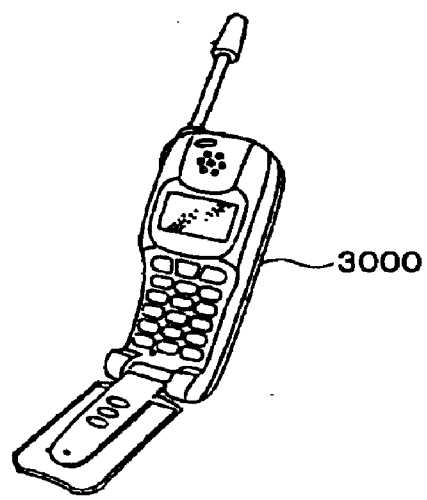
FIG. 6 is a schematic that shows an electric apparatus according to an exemplary embodiment of the present invention.

According to the exemplary embodiment of the present invention, since the electric property of the semiconductor substrate 10 is checked after the formation process of the conductive part 30 is completed, the inspection process prevents and/or reduces adversely affecting reliability in the formation process of the conductive part 30. Consequently, reliability of the method of forming a semiconductor device will be enhanced and/or improved. Other advantages are as described above. As examples of electronic equipment including a semiconductor device manufactured by the method according to the exemplary embodiments of the present invention, a notebook computer 2000 is shown in FIG. 5, and a mobile phone 3000 is shown in FIG. 6.

The present invention is not limited to the exemplary embodiments described above but applied to various kinds of exemplary modifications within the scope and spirit of the present invention. For example, the present invention includes a structure which is substantially the same as the above-mentioned structure in the exemplary embodiments (for example, a structure whose function, method and results are the same as those of the present invention, or a structure whose purposes and results are the same as those of the present invention). Also, the present invention includes a structure which is described in the above-mentioned exemplary embodiments and whose nonessential part is substituted. The present invention also includes a structure having the same effects as those of the above-mentioned exemplary embodiments, and a structure which can attain the same purposes as those of the above-mentioned exemplary embodiments. Further, the present invention includes other structures in which related art methods and techniques are incorporated into the above-mentioned exemplary embodiments.

What is claimed is:

1. A method of manufacturing a semiconductor device, comprising:

(a) preparing a semiconductor substrate having an integrated circuit and an electrode electrically coupled to the integrated circuit on the first surface of the semiconductor substrate;

(b) forming a through-hole in the electrode;

(c) forming a concave portion in the semiconductor substrate, the concave portion communicates within the through-hole;

(d) forming a conductive part within the concave portion, the conductive part formed within the through-hole;

(e) thinning the semiconductor substrate by removing a part of a second surface of the semiconductor substrate so as to make the conductive part penetrate from the first surface to the second surface;

(f) cutting the semiconductor substrate into pieces; and (g) inspecting an electric property of the semiconductor substrate through the conductive part after step (d) is finished.

2. The method of manufacturing a semiconductor device according to claim 1, further including forming the conductive part to have a brazing layer on a top surface of the conductive part in step (d).

3. The method of manufacturing a semiconductor device according to claim 1, further including forming the conductive part to have a gold layer on a top surface of the conductive part in step (d).

4. The method of manufacturing a semiconductor device according to claim 1, further including conducting the inspecting process before step (e).

5. The method of manufacturing a semiconductor device according to claim 1, step (f) further comprising:

(f1) providing a reinforcing member on the semiconductor substrate;

(f2) conducting the inspecting process; and (f3) cutting the semiconductor substrate.

6. The method of manufacturing a semiconductor device according to claim 5, further comprising applying a tape to one of the first surface or the second surface of the reinforcing member and a supporting member which supports the tape.

7. The method of manufacturing a semiconductor device according to claim 1, further including:

stacking a plurality of semiconductor devices which are manufactured by the method according to claim 1.

8. A method of manufacturing a semiconductor device, comprising:

(a) preparing a semiconductor substrate having an integrated circuit and an electrode electrically coupled to the integrated circuit on the first surface of the semiconductor substrate;

(b) forming a through-hole in the electrode;

(c) forming a conductive part within the through-hole, the conductive part penetrates the semiconductor substrate from the first surface to the second surface of the semiconductor substrate;

(d) inspecting an electric property of the semiconductor substrate through the conductive part after step (c) is finished.

* * * * *